(12) United States Patent
Nishikawa et al.

(10) Patent No.: US 11,173,806 B2
(45) Date of Patent: Nov. 16, 2021

(54) MANAGEMENT DEVICE AND POWER STORAGE SYSTEM

(71) Applicant: SANYO Electric Co., Ltd., Daito (JP)

(72) Inventors: Masato Nishikawa, Hyogo (JP); Masayuki Yoshinaga, Hyogo (JP)

(73) Assignee: SANYO Electric Co., Ltd., Daito (JP)

( * ) Notice: Subject to any disclaimer, the term of this patent is extended or adjusted under 35 U.S.C. 154(b) by 213 days.

(21) Appl. No.: 16/476,376

(22) PCT Filed: Dec. 26, 2017

(86) PCT No.: PCT/JP2017/046581
§ 371 (c)(1),
(2) Date: Jul. 8, 2019

(87) PCT Pub. No.: WO2018/131462
PCT Pub. Date: Jul. 19, 2018

(65) Prior Publication Data
US 2019/0351769 A1 Nov. 21, 2019

(30) Foreign Application Priority Data

Jan. 11, 2017 (JP) .................................. 2017-002916

(51) Int. Cl.
*B60L 58/14* (2019.01)
*G01R 31/382* (2019.01)
(Continued)

(52) U.S. Cl.
CPC ............. *B60L 58/14* (2019.02); *B60L 3/0046* (2013.01); *B60L 58/10* (2019.02); *B60L 58/15* (2019.02);
(Continued)

(58) Field of Classification Search
USPC ........................................................ 320/134
See application file for complete search history.

(56) References Cited

U.S. PATENT DOCUMENTS

2014/0015454 A1 1/2014 Kunimitsu et al.
2014/0298063 A1* 10/2014 Yoo ........................... H02J 7/02
713/323
(Continued)

FOREIGN PATENT DOCUMENTS

JP 2004-282798 A 10/2004
JP 4171449 B2 10/2008
(Continued)

OTHER PUBLICATIONS

International Search Report dated Feb. 6, 2018, issued in counterpart application No. PCT/JP2017/046581 (2 pages).

*Primary Examiner* — Mohammed Alam
(74) *Attorney, Agent, or Firm* — Westerman, Hattori, Daniels & Adrian, LLP

(57) ABSTRACT

A status signal output circuit outputs a first status signal indicating with a binary level whether or not power the storage unit is normal in accordance with a determination result of the status determination circuit, and, as a second status signal, a pulse width modulation (PWM) signal according to the status of the power storage unit when a measurement circuit including the status determination circuit is normal, or a signal having a axed level when the measurement circuit including the status determination circuit is abnormal. A control signal output circuit outputs, to a drive circuit, a control signal for control to bring a switch inserted between the power storage unit and a load into an OFF state when the power storage unit has abnormality, in accordance with the first status signal and the second status signal output from the status signal output circuit.

7 Claims, 10 Drawing Sheets

(51) Int. Cl.
B60L 58/10 (2019.01)
B60L 3/00 (2019.01)
H01M 10/42 (2006.01)
H02J 7/00 (2006.01)
B60L 58/15 (2019.01)

(52) U.S. Cl.
CPC ...... *G01R 31/382* (2019.01); *H01M 10/4257* (2013.01); *H02J 7/007* (2013.01); *H02J 7/0021* (2013.01); *H02J 7/00302* (2020.01)

(56) References Cited

U.S. PATENT DOCUMENTS

2014/0354234 A1* 12/2014 Sudan .............. H02J 13/00034
    320/127
2018/0093569 A1    4/2018 Takao et al.
2019/0351769 A1* 11/2019 Nishikawa .............. B60L 58/14

FOREIGN PATENT DOCUMENTS

WO    2012/132178 A1    10/2012
WO    2016/174828 A1    11/2016

* cited by examiner

FIG. 4

| State | Status signal (ALM) | Contactor |
|---|---|---|
| Normal | H | Close |
| Over charge | L | Open |
| Over discharge | L | Open |
| Circuit abnormality | L | Open |

FIG. 7

| State | First status signal (ALM) | Second status signal (PWM) | Contactor |
|---|---|---|---|
| Normal | H | 87.5% Duty | Close |
| Over charge | L | 12.5% Duty | Open |
| Over discharge | L | 50% Duty | Open |
| Circuit abnormality | L | Unknown (L) | Close |

FIG. 10

| State | First status signal (ALM) | Second status signal (PWM) | XOR output | Power source voltage determination signal | Contactor |
|---|---|---|---|---|---|
| Normal | H | 87.5% Duty | L | L | Close |
| Over charge | L | 12.5% Duty | H | L | Open |
| Over discharge | L | 50% Duty | H | L | Open |
| Circuit abnormality | L | Unknown (L) | L | L | Close |
| Power source voltage abnormality | L | Unknown (L) | L | H | Open |

MANAGEMENT DEVICE AND POWER STORAGE SYSTEM

TECHNICAL FIELD

The present invention relates to a management device configured to manage a power storage unit, and to a power storage system.

BACKGROUND ART

Hybrid vehicles, electric vehicles, and fuel cell vehicles have been widely spreading in recent years. These vehicles are each equipped with an auxiliary battery and a traction battery. The traction battery is configured by a secondary battery such as a lithium ion battery or a nickel hydride battery. The lithium ion battery having high energy density has recently been more often adopted as the secondary battery configuring the traction battery.

A secondary battery mounted on a vehicle needs monitoring of voltage, current, and temperature, and the lithium ion battery particularly needs strict management of these monitoring parameters. When abnormality is detected in the monitoring parameters, a management device opens a contact provided between a secondary battery and a motor drive inverter to stop charge and discharge of the secondary battery. A system configured to measure the voltage and the temperature is made redundant in order for such strict management of the monitoring parameters (see PTL 1 and the like).

CITATION LIST

Patent Literature

PTL 1: Japanese Patent No. 4171449

SUMMARY OF THE INVENTION

Redundancy of a measurement system is typically achieved with a main control system configured by software processing with use of a microcomputer and a sub control system configured only by hardware processing. One of these control systems is configured only by hardware processing to achieve cost reduction, provision of the control system free from software failure, and the like.

Such a control system configured only by hardware processing sometimes opens a contact because of failure of a measurement circuit irrespective of a normal secondary battery. A real electric vehicle equipped with no engine is brought into a travel stopped state by erroneous operation of the sub control system configured only by hardware.

The present invention has been made in view of such circumstances, and has an object to provide a technique achieving both safety and convenience in management of a power storage unit.

In order to solve the problems mentioned above, a management device according to an aspect of the present invention includes: a drive circuit configured to drive a switch inserted between a power storage unit and a load; a status determination circuit configured to determine a status of the power storage unit in accordance with monitoring data on the power storage unit; a status signal output circuit configured to output a first status signal indicating with a binary level whether or not the power storage unit is normal in accordance with a determination result of the status determination circuit, and, as a second status signal, a pulse width modulation (PWM) signal according to the status of the power storage unit when a measurement circuit including the status determination circuit is normal, or a signal having a fixed level when the measurement circuit including the status determination circuit is abnormal; and a control signal output circuit configured to output, to the drive circuit, a control signal for control to bring the switch into an OFF state when the power storage unit has abnormality, in accordance with the first status signal and the second status signal output from the status signal output circuit.

The present invention also includes effective aspects obtained by converting any appropriate combination of the constituent elements described above and expression of the present invention among a method, an apparatus, a system, and the like.

The present invention achieves both safety and convenience in management of a power storage unit.

BRIEF DESCRIPTION OF DRAWINGS

FIG. 4 is a chart of control variations of the sub control system according to the comparative example.

FIG. 7 is a chart of control variations of the sub control system according to the first exemplary embodiment.

FIG. 10 is a chart of control variations of a sub control system according to the second exemplary embodiment.

DESCRIPTION OF EMBODIMENTS

Figure 1:
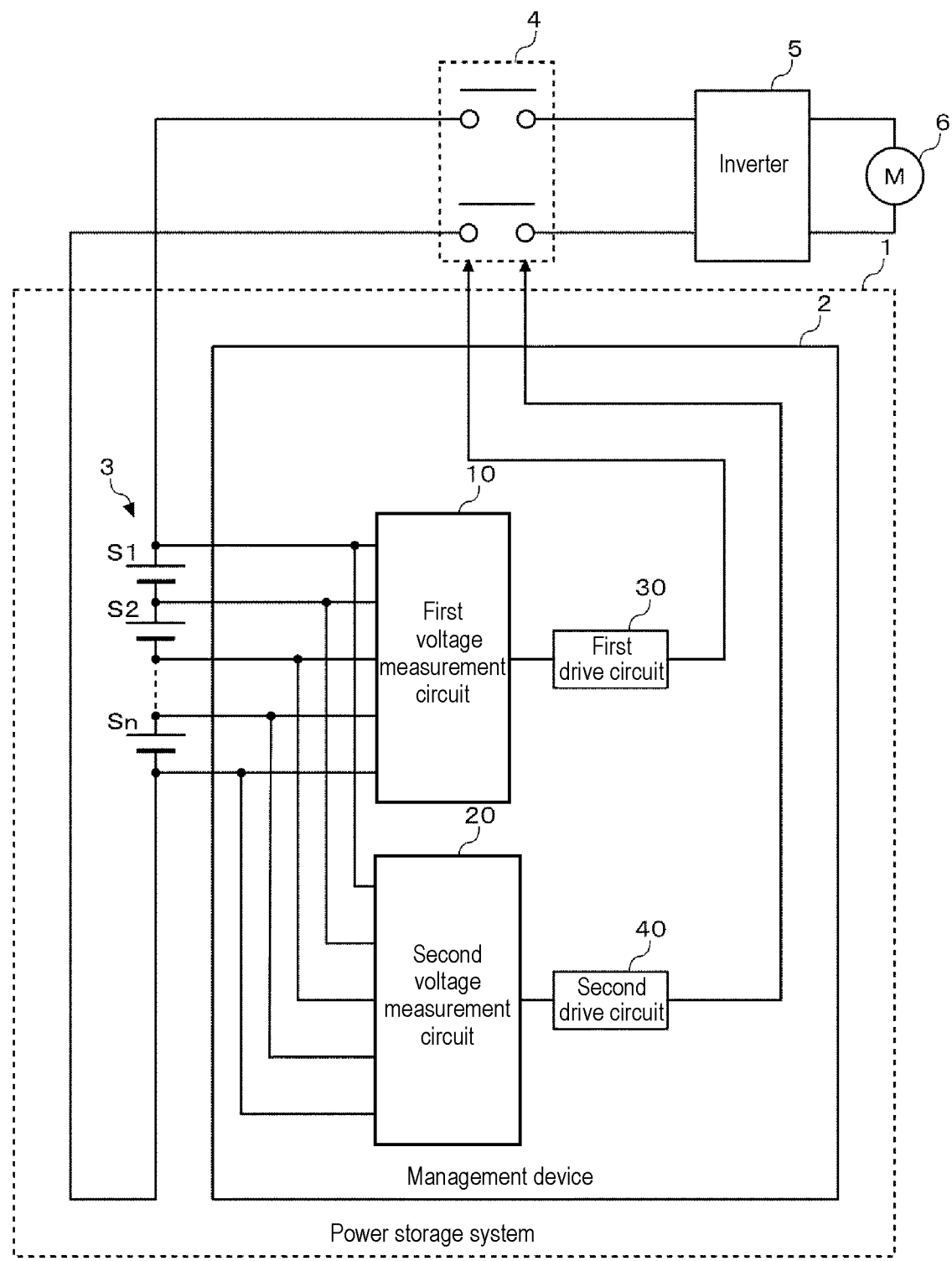
FIG. 1 is an explanatory diagram of a power storage system according to an exemplary embodiment of the present invention.

FIG. 1 is an explanatory diagram of power storage system 1 according to an exemplary embodiment of the present invention. Power storage system 1 is mounted on a vehicle and is connected to motor 6 via a contactor 4 and inverter 5. Motor 6 may have high output power to enable self travel, or may have relatively low output power to assist engine travel. During power running, inverter 5 converts direct current (DC) power supplied from power storage system 1 to alternate current (AC) power and supplies motor 6 with the AC power. During regeneration, inverter 5 converts AC power supplied from motor 6 to DC power and supplies power storage system 1 with the DC power. Contactor 4 may be configured by a relay or a power semiconductor switch. The following description assumes adoption of a relay.

Power storage system 1 includes power storage unit 3 and management device 2. Power storage unit 3 includes first cell S1 to n-th cell connected in series. Hereinafter, assume that first cell S1 to n-th cell Sn are each configured by a lithium ion battery cell having representative voltage from 3.6 V to 3.7 V. The lithium ion battery cell may be replaced with a different cell such as a nickel hydride battery cell, a lead battery cell, an electric double layer capacitor cell, or a lithium ion capacitor cell.

Management device 2 includes first voltage measurement circuit 10, second voltage measurement circuit 20, first drive circuit 30, and second drive circuit 40. First voltage measurement circuit 10 and first drive circuit 30 configure a main control system whereas second voltage measurement circuit 20 and second drive circuit 40 configure a redundant system. FIG. 1 depicts only constituent elements relevant to monitoring of voltage of first cell S1 to n-th cell Sn. Though not depicted in FIG. 1, management device 2 also monitors temperature of first cell S1 to n-th cell Sn and current flowing to first cell S1 to n-th cell Sn.

COMPARATIVE EXAMPLE

Figure 2:
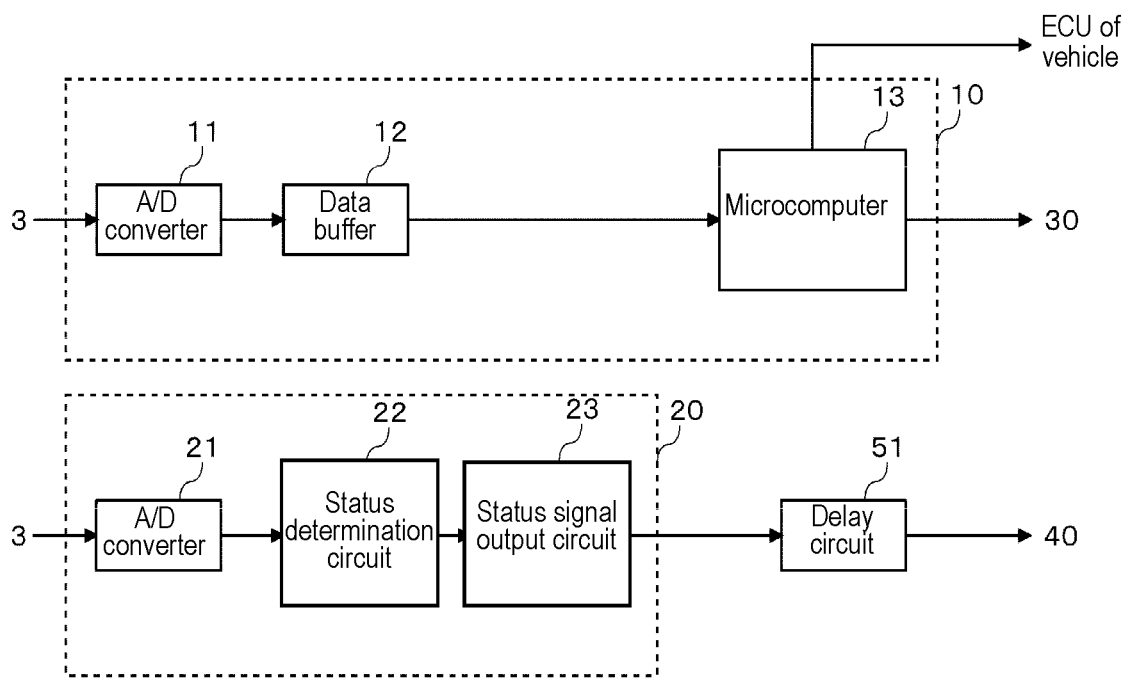
FIG. 2 is a diagram depicting a configuration of a management device according to a comparative example.

FIG. 2 is a diagram depicting a configuration of management device 2 according to the comparative example. First voltage measurement circuit 10 includes A/D converter 11, data buffer 12, and microcomputer 13. A/D converter 11 converts analog voltage of first cell S1 to n-th cell Sn received from power storage unit 3 to digital values. Data buffer 12 temporarily holds the cell voltage digital values received from A/D converter 11, and outputs the digital values to microcomputer 13 in accordance with a predetermined serial communications standard. Examples of the predetermined serial communications standard include the Serial Peripheral Interface (SPI) and the Inter-Integrated Circuit ($I^2C$).

Microcomputer 13 determines whether or not there is any cell having overcharge or overdischarge in accordance with the cell voltage digital values received from data buffer 12. If there is any cell having overcharge or overdischarge, microcomputer 13 notifies an electronic control unit (ECU) of the vehicle of the overcharge or the overdischarge. Microcomputer 13 outputs, to first drive circuit 30, a control signal causing contactor 4 to open.

In a case where first drive circuit 30 is configured by a low side driver, microcomputer 13 outputs a high level signal as the control signal causing contactor 4 to open. When the low side driver is configured by an n-channel metal oxide semiconductor field-effect transistor (MOSFET), the n-channel MOSFET is conducted in a state where the high level signal is input to a gate terminal, and is unconducted in another state where a low level signal is input to the gate terminal. In a state where the n-channel MOSFET is conducted, contactor 4 includes a coil excited to open contactor 4. In another state where the n-channel MOSFET is unconducted, the coil of contactor 4 is degaussed to close contactor 4. This example refers to a case where contactor 4 is configured by a normally closed relay.

In another case where first drive circuit 30 is configured by a high side driver, microcomputer 13 outputs a low level signal as the control signal causing contactor 4 to open. When the high side driver is configured by a p-channel MOSFET, the p-channel MOSFET is conducted in a state where the low level signal is input to the gate terminal, and is unconducted in another state where a high level signal is input to the gate terminal. In a state where the p-channel MOSFET is conducted, the coil of contactor 4 is excited to open contactor 4. In another state where the p-channel MOSFET is unconducted, the coil of contactor 4 is degaussed to close contactor 4.

Second voltage measurement circuit 20 includes A/D converter 21, status determination circuit 22, and status signal output circuit 23. A/D converter 21 converts analog voltage of first cell S1 to n-th cell Sn received from power storage unit 3 to digital values. Status determination circuit 22 determines whether or not there is any cell having overcharge or overdischarge in accordance with the cell voltage digital values. Specifically, status determination circuit 22 determines overcharge if the cell voltage is higher than an overcharge detection threshold, determines overdischarge if the cell voltage is lower than an overdischarge detection threshold, and determines as normal voltage if the cell voltage falls between these thresholds. Status determination circuit 22 outputs the determination result to status signal output circuit 23. Status signal output circuit 23 functions as an interface configured to output a status signal (alarm signal ALM) having a binary level according to the determination result.

A/D converter 21, status determination circuit 22, and status signal output circuit 23 are mounted on a single application specific integrated circuit (ASIC). A/D converter 11 and data buffer 12 may also be mounted on this ASIC. Though not depicted in FIG. 1, management device 2 further includes delay circuit 51 disposed between second voltage measurement circuit 20 and second drive circuit 40. Delay circuit 51 is configured by a D-type flip-flop or the like.

In a case where second drive circuit 40 is configured by a high side driver, status signal output circuit 23 outputs a high level signal at the normal voltage and outputs a low level signal in another case. In another case where second drive circuit 40 is configured by a low side driver, status signal output circuit 23 outputs a low level signal at the normal voltage and outputs a high level signal in another case.

Figure 3:
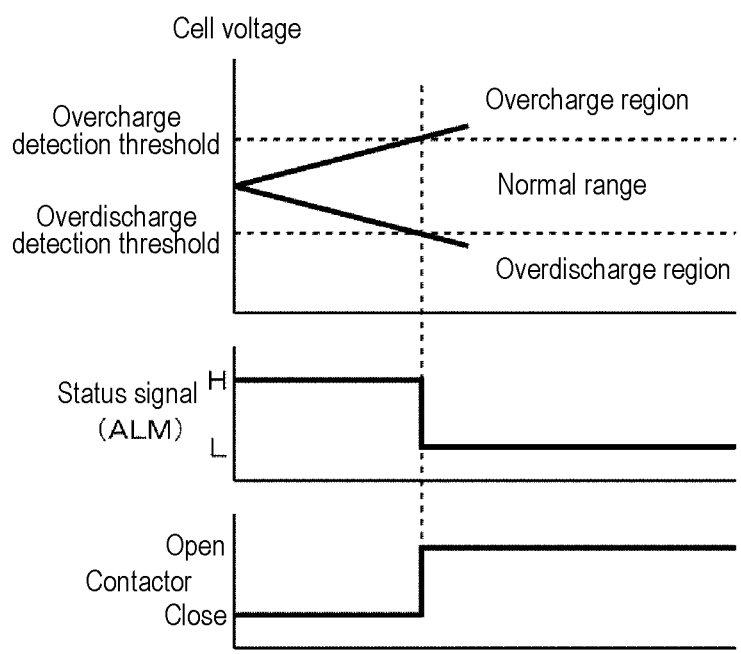
FIG. 3 is an explanatory graph on operation of a sub control system of the management device according to the comparative example.

FIG. 3 is an explanatory graph on operation of a sub control system of management device 2 according to the comparative example. FIG. 3 exemplifies the case where second drive circuit 40 is configured by a high side driver. When any of first cell S1 to n-th cell Sn has overcharge or overdischarge, status signal output circuit 23 outputs a low level signal to cause contactor 4 to open. This electrically disconnects power storage unit 3 from motor 6 to protect power storage unit 3.

Status signal output circuit 23 according to the comparative example outputs a low level signal even in a case where second voltage measurement circuit 20 itself (e.g., status determination circuit 22) has abnormality. This causes contactor 4 to open even in a case where power storage unit 3 has no abnormality.

FIG. 4 is a chart of control variations of the sub control system according to the comparative example. The status signal (alarm signal ALM) according to the comparative example has the binary level, failing to enable distinction between abnormality of power storage unit 3 and abnormality of a measurement circuit.

First Exemplary Embodiment

Figure 5:
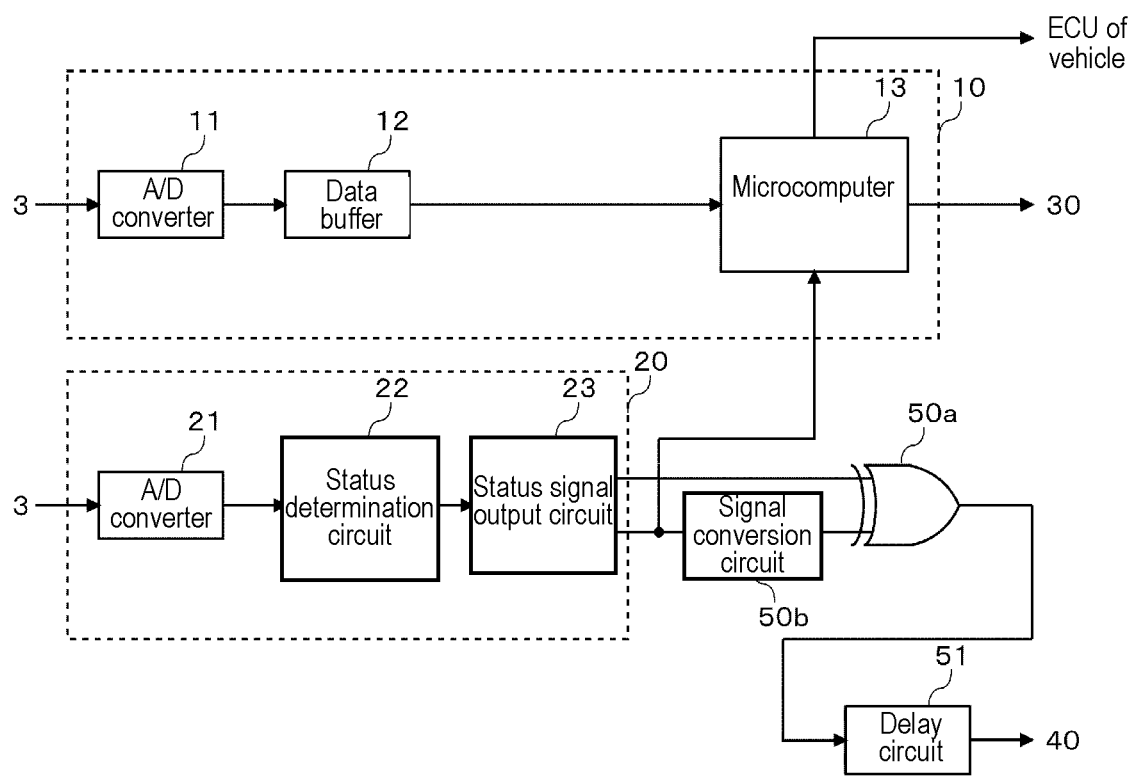
FIG. 5 is a diagram depicting a configuration of a management device according to a first exemplary embodiment of the present invention.

FIG. 5 is a diagram depicting a configuration of management device 2 according to the first exemplary embodiment of the present invention. Management device 2 according to the first exemplary embodiment includes the constituent elements of management device 2 according to the comparative example, as well as signal conversion circuit 50b and exclusive or (XOR) circuit 50a. Signal conversion circuit 50b and XOR circuit 50a are connected between second voltage measurement circuit 20 and delay circuit 51.

The first exemplary embodiment adopts a normally opened relay. In a state where second drive circuit 40 is conducted, the coil of contactor 4 is excited to close contactor 4. In another state where second drive circuit 40 is unconducted, the coil of contactor 4 is degaussed to open contactor 4. Described below is an exemplary case where second drive circuit 40 is configured by a high side driver. Contactor 4 according to this example is opened when second drive circuit 40 receives a high level signal.

Status signal output circuit 23 according to the present exemplary embodiment outputs two types of status signals, namely, a first status signal (alarm signal ALM) and a second status signal (pulse signal PWM) in accordance with a determination result of status determination circuit 22. Status signal output circuit 23 outputs the first status signal directly to XOR circuit 50a, and outputs the second status signal to signal conversion circuit 50b and microcomputer 13. The first status signal corresponds to the status signal according to the comparative example. The second status signal has a pulse of a duty differentiated in accordance with the status of power storage unit 3. In a case where the ASIC itself equipped with second voltage measurement circuit 20 has abnormality, status signal output circuit 23 outputs an Unknown signal (low level signal) as the second status signal.

Signal conversion circuit 50b converts the second status signal received from status signal output circuit 23 and outputs the converted second status signal to XOR circuit 50a. Specifically, signal conversion circuit 50b converts a pulse signal as the second status signal to a fixed high level signal and outputs the high level signal if the second status signal is a pulse signal, and signal conversion circuit 50b outputs a low level signal as the second status signal without conversion if the second status signal is a low level signal. XOR circuit 50a receives the first status signal output from status signal output circuit 23 and the second status signal converted by signal conversion circuit 50b. XOR circuit 50a outputs a low level signal if the first status signal and the second status signal are equal in level, and outputs a high level signal if the first status signal and the second status signal are unequal in level.

Figure 6:
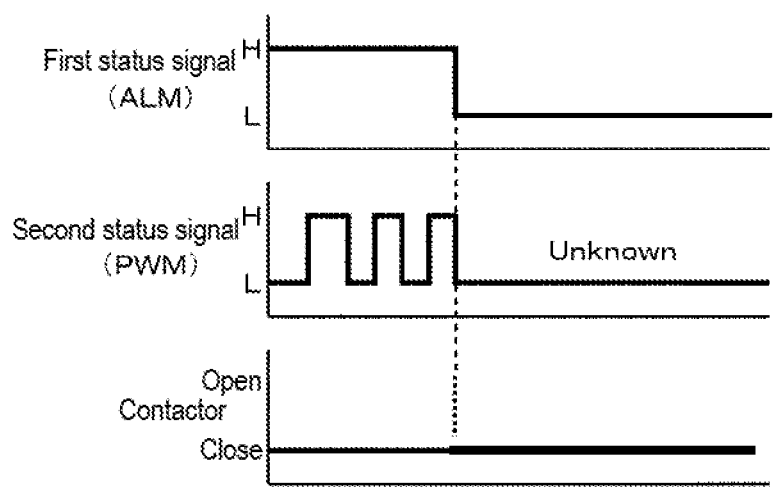
FIG. 6 is an explanatory graph on operation of a sub control system of the management device according to the first exemplary embodiment.

FIG. 6 is an explanatory graph on operation of a sub control system of management device 2 according to the first exemplary embodiment. FIG. 6 also exemplifies the case where second drive circuit 40 is configured by a high side driver. When any of first cell S1 to n-th cell Sn has overcharge or overdischarge, status signal output circuit 23 outputs the first status signal at a low level and outputs, as the second status signal, a pulse signal of a duty according to a type of abnormality.

When first cell S1 to n-th cell Sn each have normal voltage, status signal output circuit 23 outputs the first status signal at a high level and outputs, as the second status signal, a pulse signal of a first duty. Signal conversion circuit 50b converts the second status signal to a high level signal. XOR circuit 50a outputs a low level signal because the first status signal is the high level signal and the second status signal is the high level signal. Contactor 4 is kept closed in this case.

When at least one of first cell S1 to n-th cell Sn comes into an overcharged state, status signal output circuit 23 outputs the first status signal at a low level and outputs, as the second status signal, a pulse signal of a second duty. Signal conversion circuit 50b converts the second status signal to a high level signal. XOR circuit 50a outputs a high level signal because the first status signal is the low level signal and the second status signal is the high level signal. Contactor 4 is opened in this case.

When at least one of first cell S1 to n-th cell Sn comes into an overdischarging state, status signal output circuit 23 outputs the first status signal at a low level and outputs, as the second status signal, a pulse signal of a third duty. Signal conversion circuit 50b converts the second status signal to a high level signal. XOR circuit 50a outputs a high level signal because the first status signal is the low level signal and the second status signal is the high level signal. Contactor 4 is opened in this case.

When second voltage measurement circuit 20 has circuit abnormality, status signal output circuit 23 outputs the first status signal at a low level and outputs, as the second status signal, the Unknown signal (low level signal). Signal conversion circuit 50b lets the second status signal pass through without conversion. XOR circuit 50a outputs a low level signal because the first status signal is the low level signal and the second status signal is the low level signal. Contactor 4 is kept closed in this case.

FIG. 7 is a chart of control variations of the sub control system according to the first exemplary embodiment. As exemplified in FIG. 7, status signal output circuit 23 outputs the second status signal having a duty of 87.5% when first cell S1 to n-th cell Sn each have normal voltage, the second status signal having a duty of 12.5% when at least one of first cell S1 to n-th cell Sn has overcharge, and the second status signal having a duty of 50% when at least one of first cell S1 to n-th cell Sn has overdischarge.

The second status signal is output also to microcomputer 13, so that microcomputer 13 can recognize a determination result of a voltage status detected by the sub control system, inclusive of a type of abnormality. Even in a case where a main control system fails to measure voltage of first cell S1 to n-th cell Sn due to failure of A/D converter 11 or data buffer 12, microcomputer 13 can recognize voltage statuses of first cell S1 to n-th cell Sn detected by the sub control system. Microcomputer 13 can notify, in accordance with such information, the ECU of the vehicle of overcharge or overdischarge.

As described above, the first exemplary embodiment provides a redundant voltage measurement system to allow contactor 4 to open more reliably upon overcharge or overdischarge, for improved safety. Furthermore, the first exemplary embodiment provides the sub control system configured only by hardware for cost reduction in comparison to a configuration equipped with two microcomputers.

The ASIC of the sub control system outputs two status signals, namely, the first status signal (alarm signal ALM) and the second status signal (pulse signal PWM), to notify an external unit of abnormality of power storage unit 3 or abnormality of second voltage measurement circuit 20 distinguished from each other. This prevents stop of electrification to motor 6 due to abnormality of second voltage measurement circuit 20 even though power storage unit 3 is operating normally. A real electric vehicle cannot travel once electrification to motor 6 stops. When power storage unit 3 and the main control system have no abnormality, the electric vehicle is preferred to make self travel to a car dealer agent or a repair shop. The present exemplary embodiment enables continuous travel upon abnormality of second voltage measurement circuit 20 because contactor 4 does not open.

Second Exemplary Embodiment

Figure 8:
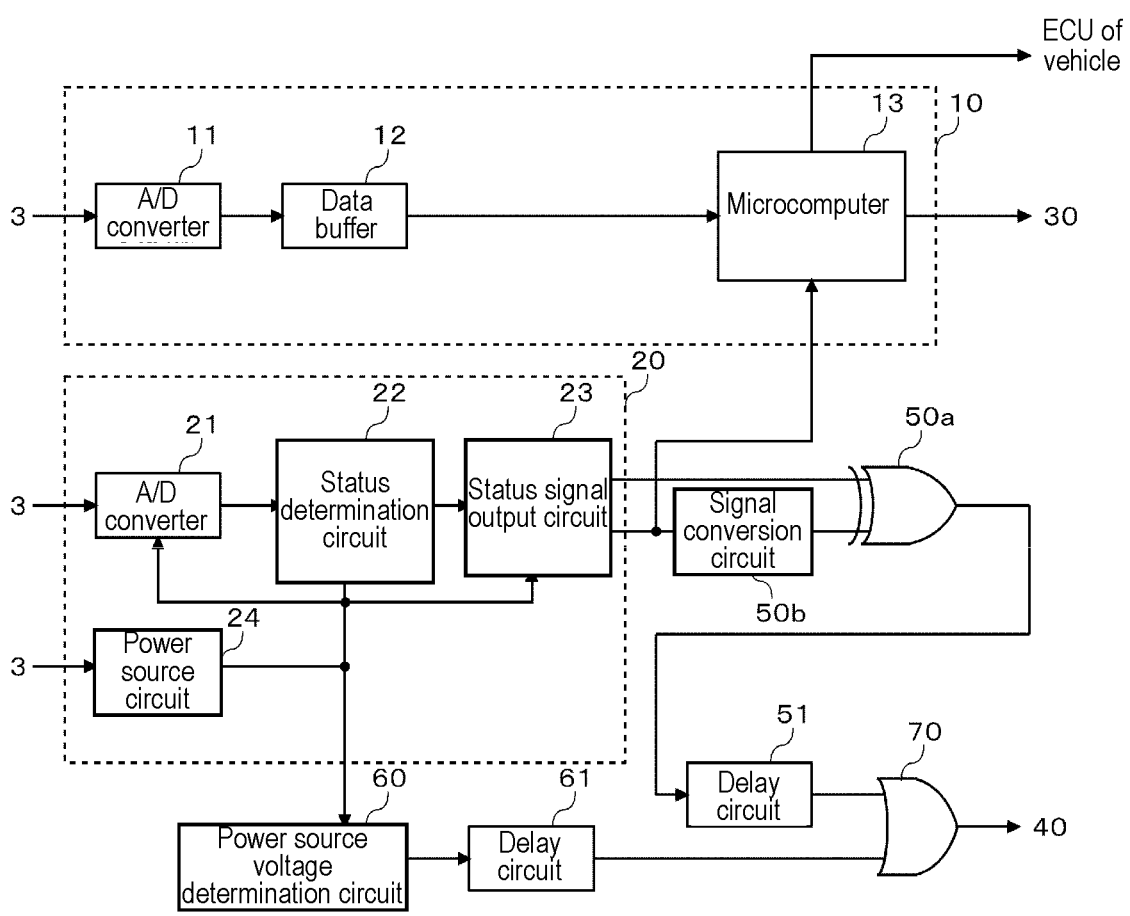
FIG. 8 is a diagram depicting a configuration of a management device according to a second exemplary embodiment of the present invention.

FIG. 8 is a diagram depicting a configuration of management device 2 according to the second exemplary embodiment of the present invention. Management device 2 according to the second exemplary embodiment includes the constituent elements of management device 2 according to the first exemplary embodiment, as well as power source voltage determination circuit 60, delay circuit 61, and OR operation (OR) circuit 70. Furthermore, second voltage measurement circuit 20 additionally includes power source circuit 24. Management device 2 has a drive power source according to a system to be supplied from an auxiliary battery (not depicted) or a system to be supplied from power storage unit 3.

The second exemplary embodiment adopts the latter system.

Power source circuit 24 acquires, as input voltage, both-end voltage of at least one of the cells in power storage unit 3. Power source circuit 24 is configured by a switching regulator or the like. Power source circuit 24 depresses the input voltage and generates predetermined constant voltage (e.g., 3 V to 5 V). The constant voltage thus generated is supplied to A/D converter 21, status determination circuit 22, and status signal output circuit 23 as power source voltage.

Power source voltage determination circuit 60 determines whether or not the power source voltage generated by power source circuit 24 is normal. Power source voltage determination circuit 60 outputs, to delay circuit 61, a power source voltage determination signal having a binary level according to a determination result of the power source voltage. Power source voltage determination circuit 60 according to the present exemplary embodiment outputs a low level signal if the power source voltage is normal, and outputs a high level signal if the power source voltage is abnormal.

OR circuit 70 receives an output signal of XOR circuit 50*a* via delay circuit 51, and an output signal of power source voltage determination circuit 60 via delay circuit 61. OR circuit 70 outputs the output signal of XOR circuit 50*a* without change when the output signal of power source voltage determination circuit 60 has a low level. This is the same as the control according to the first exemplary embodiment. OR circuit 70 outputs a high level signal regardless of logic of the output signal of XOR circuit 50*a* when the output signal of power source voltage determination circuit 60 has a high level. The output signal of OR circuit 70 is supplied to second drive circuit 40.

Figure 9:
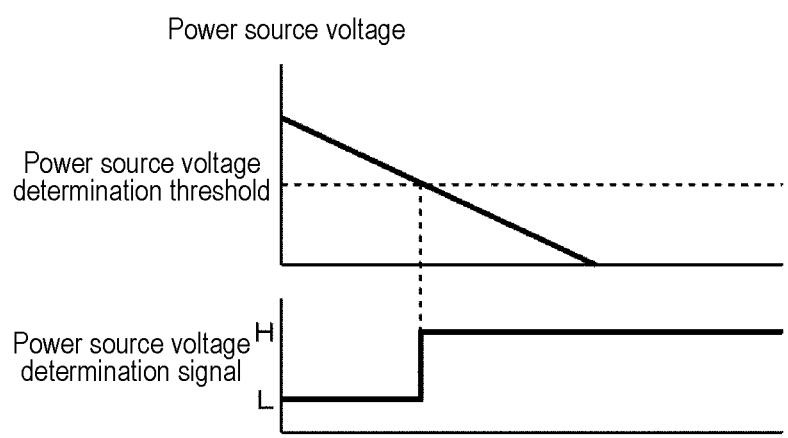
FIG. 9 is an explanatory graph on operation of a power source voltage determination circuit in the management device according to the second exemplary embodiment.

FIG. 9 is an explanatory graph on operation of power source voltage determination circuit 60 in management device 2 according to the second exemplary embodiment. Power source voltage determination circuit 60 outputs a low level signal if the power source voltage generated by power source circuit 24 exceeds a power source voltage determination threshold, and outputs a high level signal if the power source voltage is less than or equal to the threshold.

FIG. 10 is a chart of control variations of a sub control system according to the second exemplary embodiment. In comparison to the exemplification in FIG. 7, exemplification in FIG. 10 has case division differentiated between a case where any constituent element other than power source circuit 24 in second voltage measurement circuit 20 has abnormality and a case where power source circuit 24 has abnormality. In the latter case, second voltage measurement circuit 20 has power source failure to cause failure in entire measurement function of the sub control system. There may also be an overdischarging cell. Contactor 4 is opened also in this case to prioritize protection of power storage unit 3.

As described above, the second exemplary embodiment exerts effects similar to the effects of the first exemplary embodiment and achieves more detailed control in comparison to the first exemplary embodiment.

The present invention has been described with reference to the exemplary embodiments. Those skilled in the art will comprehend that the exemplary embodiments are merely exemplified, the constituent elements and the processing processes have various modification examples in terms of combination, and such modification examples are included in the scope of the present invention.

The first and second exemplary embodiments described above exemplify redundancy of the voltage measurement system. The techniques according to the first and second exemplary embodiments are applicable also to redundancy of a temperature control system. In this case, overcharge and overdischarge may be replaced with high-temperature abnormality and low-temperature abnormality, respectively.

The first exemplary embodiment exemplarily adopts XOR circuit 50*a* and signal conversion circuit 50*b*. The present invention may alternatively adopt any other logical circuits equivalent to XOR circuit 50*a* and signal conversion circuit 50*b*. OR circuit 70 may be replaced with a different logical circuit equivalent to OR circuit 70.

The exemplary embodiments may be specified by the following items.

[Item 1]

Management device (2) including:

drive circuit (40) configured to drive switch (4) inserted between power storage unit (3) and load (6);

status determination circuit (22) configured to determine a status of power storage unit (3) in accordance with monitoring data on power storage unit (3);

status signal output circuit (23) configured to output a first status signal indicating with a binary level whether or not power storage unit (3) is normal in accordance with a determination result of status determination circuit (22), and, as a second status signal, a pulse width modulation (PWM) signal according to the status of power storage unit (3) when measurement circuit (20) including status determination circuit (22) is normal, or a signal having a fixed level when measurement circuit (20) including status determination circuit (22) is abnormal; and control signal output circuit (50*a*, 50*b*) configured to output, to drive circuit (40), a control signal for control to bring switch (4) into an OFF state when power storage unit (3) has abnormality, in accordance with the first status signal and the second status signal output from status signal output circuit (23).

According to this item, a configuration for control of switch (4) with use of hardware prevents switch (4) from being turned OFF due to abnormality of status determination circuit (22) even though power storage unit (3) is normal.

[Item 2]

Management device (2) according to item 1, further including microcomputer (13) configured to determine the status of power storage unit (3) in accordance with the monitoring data on power storage unit (3); in which microcomputer (13) outputs, to another drive circuit (20) configured to drive switch (4), the control signal for control to bring switch (4) into the OFF state upon detection of abnormality of power storage unit (3).

This configuration achieves redundancy of status monitoring of power storage unit (3) with use of a software control system and a hardware control system.

[Item 3]

Management device (2) according to item 1 or 2, in which status determination circuit (22) determines whether or not cell (S1 to Sn) included in power storage unit (3) has overcharge or overdischarge in accordance with measured voltage of cell (S1 to Sn), status signal output circuit (23) outputs, as the first status signal, a high level signal when power storage unit (3) is normal or a [[high]'] low level signal in another case, status signal output circuit (23) outputs, as the second status signal, a first PWM signal having a first duty ratio when cell (S1 to Sn) is normal, a second PWM signal having a second duty ratio when cell (S1 to Sn) has overcharge, a third PWM signal having a third duty ratio when cell (S1 to Sn) has overdischarge, and a low level signal when measurement circuit (20) has abnormality, and control, signal output circuit (50a, 50b) outputs a control signal for control to bring the switch into an ON state when both the first stains signal and the second status signal are low level signals.

This configuration enables the hardware control system to notify an external unit of normality or abnormality of power storage unit (3) and a type of the abnormality where applicable.

[Item 4]

Management device (2) according to item 2, in which status determination circuit (22) determines whether or not cell (S1 to Sn) included in power storage unit (3) has overcharge or overdischarge in accordance with measured voltage of cell (S1 to Sn), status signal output circuit (23) outputs, as the first status signal, a low level signal when power storage unit (3) is normal or a high level signal in another case, status signal output circuit (23) outputs, as the second status signal, a first PWM signal having a first duty ratio when cell (S1 to Sn) is normal, a second PWM signal having a second duty ratio when cell (S1 to Sn) has overcharge, a third PWM signal having a third duty ratio when cell (S1 to Sn) has overdischarge, and a low level signal when measurement circuit (20) has abnormality, and control signal output circuit (50a, 50b) includes signal conversion circuit (50b) configured to convert the PWM signal as the second status signal to a high level signal, and keeps a low level signal as the second status signal without conversion, and exclusive OR circuit (50a) configured to receive the first status signal output from status signal output circuit (23) and the second status signal output from signal conversion circuit (50b), switch (4) is controlled to come into the OFF state when exclusive OR circuit (50a) outputs a high level signal, and switch (4) is controlled to come into an ON state when exclusive OR circuit (50a) outputs a low level signal, and the second status signal output from status signal output circuit (23) is also received by microcomputer (13).

This configuration enables the hardware control system to notify the software control system of normality or abnormality of power storage unit (3) and a type of the abnormality where applicable. [Item 5]

Management device (2) according to any one of items 1 to 4, further including power source voltage determination circuit (60) configured to determine power source voltage supplied to status determination circuit (22) and status signal output circuit (23), in which control signal output circuit (50a, 50b, 70) outputs a control signal according to the first status signal and the second status signal output from status signal output circuit (23) when the power source voltage is normal, or outputs the control signal for control to bring switch (4) into the OFF state when the power source voltage is abnormal.

This configuration achieves more detailed control reflecting a state of the power source voltage supplied to status determination circuit (22) and status signal output circuit (23). [Item 6]

Power storage system (1) including:

power storage unit (3); and management device (2) according to any one of items 1 to 5, configured to manage power storage unit (3).

This configuration achieves provision of power storage system (1) preventing switch (4) from being turned OFF due to abnormality of status determination circuit (22) even though power storage unit (3) is normal.

The invention claimed is:

1. A management device comprising:
   a drive circuit configured to drive a switch inserted between a power storage unit and a load;
   a status determination circuit configured to determine a status of the power storage unit in accordance with monitoring data on the power storage unit;
   a status signal output circuit configured to output a first status signal indicating with a binary level whether or not the power storage unit is normal in accordance with a determination result of the status determination circuit, and, as a second status signal, a pulse width modulation (PWM) signal according to the status of the power storage unit when a measurement circuit including the status determination circuit is normal, or a signal having a fixed level when the measurement circuit including the status determination circuit is abnormal;
   a control signal output circuit configured to output, to the drive circuit, a control signal for control to bring the switch into an OFF state when the power storage unit has abnormality, in accordance with the first status signal and the second status signal output from the status signal output circuit; and
   a microcomputer configured to determine the status of the power storage unit in accordance with the monitoring data on the power storage unit; wherein
   the microcomputer outputs, to another drive circuit configured to drive the switch, the control signal for control to bring the switch into the OFF state upon detection of abnormality of the power storage unit.

2. A management device comprising:
   a drive circuit configured to drive a switch inserted between a power storage unit and a load;
   a status determination circuit configured to determine a status of the power storage unit in accordance with monitoring data on the power storage unit;
   a status signal output circuit configured to output a first status signal indicating with a binary level whether or not the power storage unit is normal in accordance with a determination result of the status determination circuit, and, as a second status signal, a pulse width modulation (PWM) signal according to the status of the power storage unit when a measurement circuit including the status determination circuit is normal, or a signal having a fixed level when the measurement circuit including the status determination circuit is abnormal;
   a control signal output circuit configured to output, to the drive circuit, a control signal for control to bring the switch into an OFF state when the power storage unit has abnormality, in accordance with the first status signal and the second status signal output from the status signal output circuit, wherein the status determination circuit determines whether or not a cell included in the power storage unit has overcharge or overdischarge in accordance with measured voltage of the cell, the status signal output circuit outputs, as the first status signal, a high level signal when the power storage unit is normal or a low level signal in another case, the status signal output circuit outputs, as the second status signal, a first PWM signal having a first duty ratio when the cell is normal, a second PWM signal having a second duty ratio when the cell has overcharge, a third PWM signal having a third duty ratio when the cell has overdischarge, and a low level signal when the measurement circuit has abnormality, and the control signal output circuit outputs a control signal for control to bring the switch into an ON state when both the first status signal and the second status signal are low level signals.

3. The management device according to claim 1, wherein the status determination circuit determines whether or not a cell included in the power storage unit has overcharge or overdischarge in accordance with measured voltage of the cell, the status signal output circuit outputs, as the first status signal, a low level signal when the power storage unit is normal or a high level signal in another case, the status signal output circuit outputs, as the second status signal, a first PWM signal having a first duty ratio when the cell is normal, a second PWM signal having a second duty ratio when the cell has overcharge, a third PWM signal having a third duty ratio when the cell has overdischarge, and a low level signal when the measurement circuit has abnormality, the control signal output circuit includes
- a signal conversion circuit configured to convert the PWM signal as the second status signal to a high level signal, and keeps a low level signal as the second status signal without conversion, and
- an exclusive OR circuit configured to receive the first status signal output from the status signal output circuit and the second status signal output from the signal conversion circuit, the switch is controlled to come into the OFF state when the exclusive OR circuit outputs a high level signal, and the switch is controlled to come into an ON state when the exclusive OR circuit outputs a low level signal, and the second status signal output from the status signal output circuit is also received by the microcomputer.

4. The management device according to claim 1, further comprising a power source voltage determination circuit configured to determine power source voltage supplied to the status determination circuit and the status signal output circuit, wherein the control signal output circuit outputs a control signal according to the first status signal and the second status signal output from the status signal output circuit when the power source voltage is normal, or outputs the control signal for control to bring the switch into the OFF state when the power source voltage is abnormal.

5. A power storage system comprising:

a power storage unit;

and a management device comprising:

a drive circuit configured to drive a switch inserted between a power storage unit and a load;

a status determination circuit configured to determine a status of the power storage unit in accordance with monitoring data on the power storage unit;

a status signal output circuit configured to output a first status signal indicating with a binary level whether or not the power storage unit is normal in accordance with a determination result of the status determination circuit, and, as a second status signal, a pulse width modulation (PWM) signal according to the status of the power storage unit when a measurement circuit including the status determination circuit is normal, or a signal having a fixed level when the measurement circuit including the status determination circuit is abnormal;

a control signal output circuit configured to output, to the drive circuit, a control signal for control to bring the switch into an OFF state when the power storage unit has abnormality, in accordance with the first status signal and the second status signal output from the status signal output circuit, wherein the management device is configured to manage the power storage unit.

6. The power storage system according to claim 5, further comprising a power source voltage determination circuit configured to determine power source voltage supplied to the status determination circuit and the status signal output circuit, wherein the control signal output circuit outputs a control signal according to the first status signal and the second status signal output from the status signal output circuit when the power source voltage is normal, or outputs the control signal for control to bring the switch into the OFF state when the power source voltage is abnormal.

7. The management device according to claim 2, further comprising a power source voltage determination circuit configured to determine power source voltage supplied to the status determination circuit and the status signal output circuit, wherein the control signal output circuit outputs a control signal according to the first status signal and the second status signal output from the status signal output circuit when the power source voltage is normal, or outputs the control signal for control to bring the switch into the OFF state when the power source voltage is abnormal.

* * * * *